United States Patent
Lai et al.

(10) Patent No.: US 9,406,845 B2
(45) Date of Patent: Aug. 2, 2016

(54) NITRIDE SEMICONDUCTOR STRUCTURE

(71) Applicant: PlayNitride Inc., Tainan (TW)

(72) Inventors: Yen-Lin Lai, Tainan (TW); Jyun-De Wu, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 14/810,433

(22) Filed: Jul. 27, 2015

(65) Prior Publication Data

US 2016/0087154 A1    Mar. 24, 2016

(30) Foreign Application Priority Data

Sep. 19, 2014  (TW) .............................. 103132462 A

(51) Int. Cl.
| | |
|---|---|
| *H01L 29/06* | (2006.01) |
| *H01L 33/32* | (2010.01) |
| *H01L 33/06* | (2010.01) |
| *H01L 29/15* | (2006.01) |

(52) U.S. Cl.
CPC ............ *H01L 33/325* (2013.01); *H01L 29/152* (2013.01); *H01L 33/06* (2013.01)

(58) Field of Classification Search
CPC .............................. H01L 29/15; H01L 29/152
USPC ............................................................ 257/15
See application file for complete search history.

(56) References Cited

U.S. PATENT DOCUMENTS

| | | | | |
|---|---|---|---|---|
| 8,134,170 | B2* | 3/2012 | Oh ...................... | H01L 21/0237 257/14 |
| 8,362,503 | B2* | 1/2013 | Saxler .................... | H01L 29/15 257/15 |
| 8,742,396 | B2* | 6/2014 | Ooshika ................. | H01L 29/15 257/15 |

* cited by examiner

*Primary Examiner* — Chandra Chaudhari
(74) *Attorney, Agent, or Firm* — Jianq Chyun IP Office

(57) ABSTRACT

A nitride semiconductor structure including a substrate, a first type nitride semiconductor layer disposed on the substrate, an active layer disposed between the substrate and the first type nitride semiconductor layer and a second type nitride semiconductor layer disposed between the substrate and the active layer is provided. The active layer includes a first multiple quantum well structure including a plurality of first quantum well layers and a plurality of first barrier layers staggered with each other, and a second multiple quantum well structure including a plurality of second quantum well layers and a plurality of second barrier layers staggered with each other. A second type dopant is doped into at least one of the second barrier layers, and a concentration of the second dopant in the second barrier layer is higher than that of the second dopant in the second type nitride semiconductor layer.

23 Claims, 5 Drawing Sheets

NITRIDE SEMICONDUCTOR STRUCTURE

CROSS-REFERENCE TO RELATED APPLICATION

This application claims the priority benefit of Taiwan application serial no. 103132462, filed on Sep. 19, 2014. The entirety of the above-mentioned patent application is hereby incorporated by reference herein and made a part of this specification.

BACKGROUND OF THE INVENTION

1. Field of the Invention

The present invention generally relates to a nitride semiconductor structure, in particular to a nitride semiconductor structure having improved work efficiency.

2. Description of Related Art

Light-emitting diode (LED) is a nitride semiconductor structure formed from compound containing semiconductor materials of elements in III-V group, such as gallium nitride, gallium phosphide and gallium arsenide. The LED in use has life time up to 100,000 hours and has advantages of fast response speed (about $10^{-9}$ seconds), small volume, saving power, low contamination, high reliability and easy for massive production, and so on. Therefore, the LED has been used a lot in various applications, such as illuminating apparatus, traffic sign, cellular phone, scanner and fax machine However, generally in the fabrication process for the nitride semiconductor structure, a lattice dislocation may easily occur during epitaxy process of semiconductor due to the difference about the lattice constant and the thermal expansion coefficient (CTE) between the semiconductor layer and the substrate. Further, an issue of thermal stress can also occur due to mismatch of the thermal expansion coefficient (CTE). The nitride semiconductor structure suffers the stress and gets serious bending, which increases the possibility for the occurrence of crack and influences work efficiency.

SUMMARY OF THE INVENTION

Accordingly, the present invention is directed to a nitride semiconductor structure having improved work efficiency.

A nitride semiconductor structure of the present invention includes a substrate, a first type nitride semiconductor layer, an active layer, and a second type nitride semiconductor layer. The first type nitride semiconductor layer is disposed on the substrate, wherein a first type dopant is doped into the first type nitride semiconductor layer. The active layer is disposed between the substrate and the first type nitride semiconductor layer, and includes a first multiple quantum well structure and a second multiple quantum well structure. The first multiple quantum well structure is a structure including multiple first quantum well layers and multiple first barrier layers, which are stacked by interlacing. The second multiple quantum well structure is a structure including multiple second quantum well layers and multiple second barrier layers, which are stacked by interlacing. The first multiple quantum well structure is disposed between the first type nitride semiconductor layer and the second multiple quantum well structure. The second type nitride semiconductor layer is disposed between the substrate and the active layer. A second type dopant is doped into the second type nitride semiconductor layer. The second type dopant is doped into at least one second barrier layer, and a doping concentration of the second type dopant in the second barrier layer is higher than a doping concentration of the second type dopant in the second type nitride semiconductor layer.

In an embodiment of the present invention, the second type dopant is doped into these second barrier layers, and a doping concentration of the second type dopant in the second barrier layers is higher than a doping concentration of the second type dopant in the second type nitride semiconductor layer.

In an embodiment of the present invention, the first type dopant is selected from the elements of IIA group, and the second type dopant is selected from the elements of IVA group.

In an embodiment of the present invention, the first type dopant is magnesium and the second type dopant is silicon.

In an embodiment of the present invention, the second multiple quantum well structure has multiple V-shape cracks.

In an embodiment of the present invention, the first multiple quantum well structure has multiple V-shape cracks and a density of the V-shape cracks in the second multiple quantum well structure is higher than a density of the V-shape cracks in the first multiple quantum well structure.

In an embodiment of the present invention, a surface of the second multiple quantum well structure is not smooth, in which the surface has multiple indents and a portion of the first multiple quantum well structure fills into the indents.

In an embodiment of the present invention, the doping concentration of the second type dopant in the second barrier layer is about between $10^{19}/cm^3$ and $9\times10^{19}/cm^3$. The doping concentration of the second type dopant in the second type nitride semiconductor layer is about between $10^{18}/cm^3$ and $9\times10^{18}/cm^3$.

In an embodiment of the present invention, the number of the second quantum well layers is more than the number of the first quantum well layers.

In an embodiment of the present invention, the number of the first quantum well layers is between 3 and 15, and the number of the second quantum well layers is between 13 and 25.

In an embodiment of the present invention, the second multiple quantum well structure does not emit light, or the second multiple quantum well structure emits a light with a wavelength range different from a wavelength range of a light emitted by the first multiple quantum well structure.

In an embodiment of the present invention, the first multiple quantum well structure has no the second type dopant.

A nitride semiconductor structure of the present invention includes a substrate, a first type nitride semiconductor layer, an active layer, and a second type nitride semiconductor layer. The first type nitride semiconductor layer is disposed on the substrate, wherein a first type dopant is doped into the first type nitride semiconductor layer. The active layer is disposed between the substrate and the first type nitride semiconductor layer, and includes a first multiple quantum well structure and a heavily doped layer. The first multiple quantum well structure is a structure including multiple first quantum well layers and multiple first barrier layers, which are stacked by interlacing. The first multiple quantum well structure is disposed between the first nitride semiconductor layer and the heavily doped layer. The second type nitride semiconductor layer is disposed between the substrate and the active layer. A second type dopant is doped into the second type nitride semiconductor layer. The second type dopant is doped into the heavily doped layer, and a doping concentration of the second type dopant in the heavily doped layer is higher than a doping concentration of the second type dopant in the second type nitride semiconductor layer.

In an embodiment of the present invention, the first type dopant is selected from the elements of IIA group, and the second type dopant is selected from the elements of IVA group.

In an embodiment of the present invention, the first type dopant is magnesium and the second type dopant is silicon.

In an embodiment of the present invention, the heavily doped layer has multiple V-shape cracks and a portion of the first multiple quantum well structure fills into the V-shape cracks.

In an embodiment of the present invention, a surface of the heavily doped layer is not smooth, in which the surface has multiple indents and a portion of the first multiple quantum well structure fills into the indents.

In an embodiment of the present invention, the doping concentration of the second type dopant in the heavily doped layer is about between $10^{19}/cm^3$ and $9 \times 10^{19}/cm^3$.

The doping concentration of the second type dopant in the second type nitride semiconductor layer is about between $10^{18}/cm^3$ and $9 \times 10^{18}/cm^3$.

In an embodiment of the present invention, the active layer further includes a second multiple quantum well structure, the second multiple quantum well structure is a structure including multiple second quantum well layers and multiple second barrier layers, which are stacked by interlacing, and the second multiple quantum well structure is disposed between the second type nitride semiconductor layer and the heavily doped layer.

In an embodiment of the present invention, the second multiple quantum well structure does not emit light, or the second multiple quantum well structure emits a light with a wavelength range different from a wavelength range of a light emitted by the first multiple quantum well structure.

In an embodiment of the present invention, the number of the second quantum well layers is more than the number of the first quantum well layers.

In an embodiment of the present invention, the number of the first quantum well layers is between 3 and 15, and the number of the second quantum well layers is between 13 and 25.

In an embodiment of the present invention, the first multiple quantum well structure has no the second type dopant.

In the foregoing descriptions, the nitride semiconductor structure of the present invention dopes the second type dopant into at least one of the second barrier layers, and a doping concentration of the second type dopant in the second barrier layer is higher than a doping concentration of the second type dopant in the second type nitride semiconductor layer, so the second multiple quantum well structure has multiple V-shape cracks. Alternatively, the nitride semiconductor structure of the present invention forms a heavily doped layer over the second type semiconductor layer, so the heavily doped layer has multiple V-shape cracks with opening end toward the first type semiconductor layer. After then, when the first multiple quantum well structure is formed over the second multiple quantum well structure or the heavily doped layer, the stress exits in the first multiple quantum well structure can be released in better manner, resulting in a better work efficiency, such as light-emitting efficiency, as a whole for the nitride semiconductor structure.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
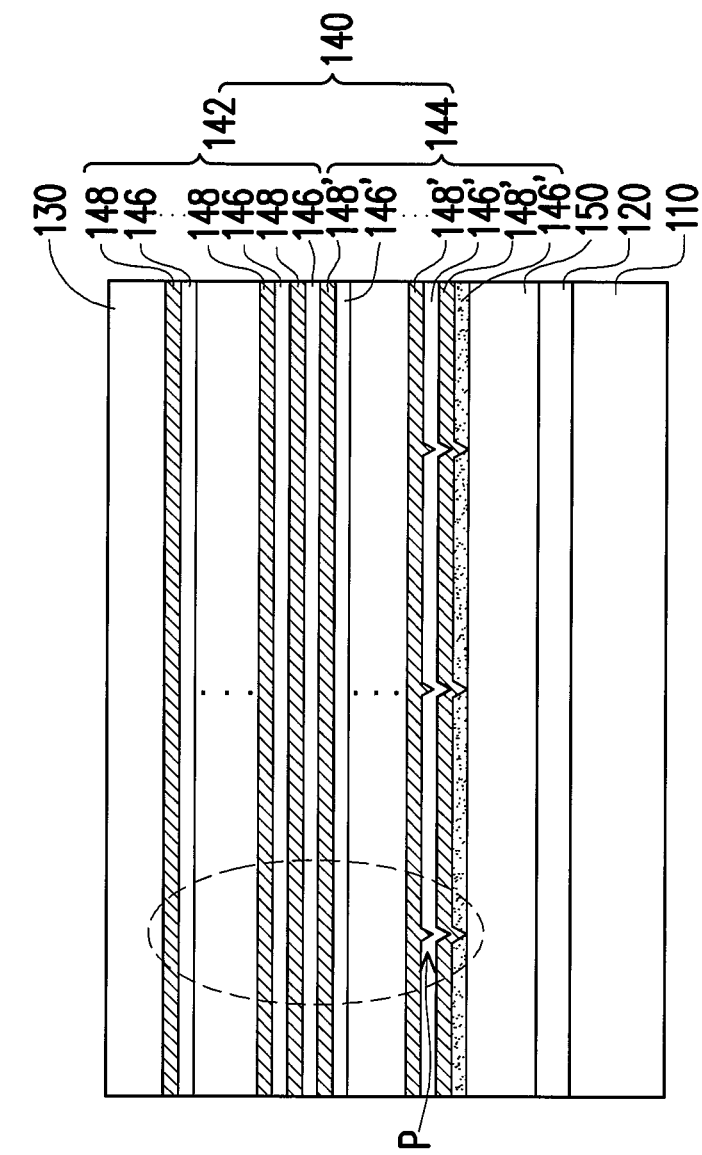
FIG. 1 is a drawing, schematically illustrating a cross-sectional structure of a nitride semiconductor structure, according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a drawing, schematically illustrating a cross-sectional structure of a nitride semiconductor structure, according to an embodiment of the invention. Referring to FIG. 1, in the embodiment, the nitride semiconductor structure 100 is taking the LED as an example, but the type of the nitride semiconductor structure 100 is not just limited to the LED.

The nitride semiconductor structure 100 of the invention includes a substrate 110, a buffer layer 120 disposed on the substrate 110, a first type nitride semiconductor layer 130 disposed on the buffer layer 120, an active layer 140 disposed between the substrate 110 and the first type nitride semiconductor layer 130 and a second type nitride semiconductor layer 150 disposed between the buffer layer 120 and the active layer 140.

In the embodiment, the substrate 100 can be a sapphire substrate. However, in other embodiment, the substrate can be any material suitable for growing a semiconductor layer of the elements in III-V group, such as the elements of nitride in III group, can be taken. For example, the substrate can be silicon, glass ($SiO_2$), GaN, AlN, spinnel, SiC, GaAs, $LiGaO_2$, $LiAlO_2$, or $MgAl_2O_4$.

The buffer layer 120 is disposed on the substrate 110. The second type nitride semiconductor layer 150 is to be grown subsequently. Because the lattice constant and the thermal expansion coefficient (CTE) have great difference between the second type nitride semiconductor layer 150 and the substrate 110, the lattice mismatch and the thermal expansion coefficient (CTE) mismatch would occur. In the embodiment, the buffer layer 120 is disposed between the second type nitride semiconductor layer 150 and the substrate 110, so as to reduce the phenomena of the lattice mismatch and the thermal expansion coefficient (CTE) mismatch. In other words, the buffer layer 120 can improve the epitaxy quality of the second type nitride semiconductor layer 150, which is subsequently stacked on the substrate 110. It can also avoid the effect on the light-emitting efficiency of the nitride semiconductor structure 100. Certainly, in the other embodiments, the buffer layer 120 can be omitted in the nitride semiconductor structure 100, so the second type nitride semiconductor layer 150 is directly disposed on the substrate 110.

In the embodiment, the first type nitride semiconductor layer 130 and the second type nitride semiconductor layer 150 in an example are GaN, AlGaN, or InGaN. However, the first type nitride semiconductor layer 130 and the second type nitride semiconductor layer 150 are not just limited to those materials.

In the embodiment, the first type nitride semiconductor layer 130 in an example is a stack layer from the P-type nitride semiconductor, and the second type nitride semiconductor layer 150 in an example is an N-type nitride semiconductor layer. A first type dopant is in the first type nitride semiconductor layer 130 and the second type dopant is doped into the second type nitride semiconductor layer 150. In the embodiment, the first type dopant is selected from the elements of the IIA group. The second type dopant is selected from the elements of the NA group. The first type dopant in an example is magnesium and the second type dopant in an example is silicon, but the first type dopant and the second type dopant are not limited to those.

The active layer 140 includes a first multiple quantum well structure 142 and a second multiple quantum well structure 144. The first multiple quantum well structure 142 is a structure including multiple first barrier layers 146 and multiple first quantum well layers 148, which are stacked by interlacing. The second multiple quantum well structure 144 is a structure including multiple second barrier layers 146' and multiple second quantum well layers 148', which are stacked by interlacing. The first multiple quantum well structure 142 is disposed between the first type nitride semiconductor layer 130 and the second multiple quantum well structure 144. In the embodiment, the number of the second quantum well layers 148' is more than the number of the first quantum well layers 148. For example, the number of the first quantum well layers 148 is between 3 and 15 and the number of the second quantum well layers 148' is between 13 and 25. However, the number of the first quantum well layers 148 and the number of the second quantum well layers 148' are not just limited to those.

The first multiple quantum well structure 142 has no the second type dopant inside and the second type dopant is doped into at least one of the second barrier layers 146'. In the embodiment, the second type dopant is doped into one of the second barrier layers 146'. The doping concentration of the second type dopant in the second barrier layers 146' is higher than a doping concentration of the second type dopant in the second type nitride semiconductor layer 150. In detail, the doping concentration of the second type dopant in the second barrier layers 146' is about between $10^{19}/cm^3$ and $9\times10^{19}/cm^3$. The doping concentration of the second type dopant in the second type nitride semiconductor layer 150 is about between $10^{18}/cm^3$ and $9\times10^{18}/cm^3$.

Figure 2:
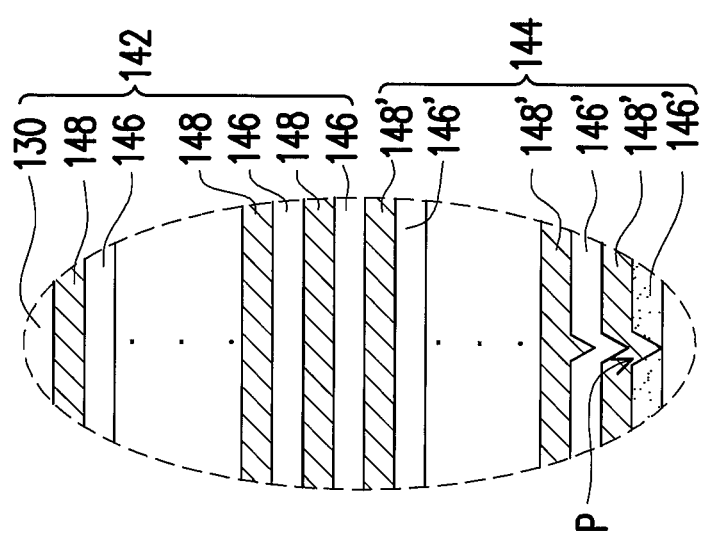
FIG. 2 is a drawing, schematically illustrating an expansion structure of a part of the nitride semiconductor structure in FIG. 1.

FIG. 2 is a drawing, schematically illustrating an expansion structure of a part of the nitride semiconductor structure in FIG. 1. Referring to FIG. 1 and FIG. 2, in the embodiment, since the doping concentration of the second type dopant in the second barrier layer 146', which is at the bottom of the second multiple quantum well structure 144, is relatively higher so that the cracks are easily occurred in the second barrier layer 146', such as the V-shape cracks P with multiple openings upward as shown in FIG. 1 and FIG. 2. In other words, the V-shape cracks P cause the surface of the second barrier layer 146' located at the bottom to be not smooth, in which the multiple indents are on the surface. When the second quantum well layers 148' of the second multiple quantum well structure 144 are subsequently formed, a portion of the second quantum well layers 148' over the second barrier layer 146' as the lowest layer would fill into the V-shape cracks P (indents). The other second barrier layers 146' and the second quantum well layers 148' formed later would gradually get to even.

Certainly, in the other embodiments, any one of the second barrier layers 146' can be doped with relative high doping concentration of the second dopant. If the second barrier layers 146' doped with relative high doping concentration of the second dopant is in higher position of the second multiple quantum well structure 144, the V-shape cracks P occur in the second barrier layers 146' may cause the surface of the second multiple quantum well structure 144 to be not smooth, in which multiple indents occur on the surface. Therefore, when the first multiple quantum well structure 142 is subsequently formed, a portion of the first multiple quantum well structure 142 would fill into the V-shape cracks P (indents).

Anyhow the higher doping concentration of the second dopant is doped into any one of the second barrier layers 146' of the second multiple quantum well structure 144, when the sufficient density of the V-shape cracks P exits in the second multiple quantum well structure 144, the stress exits in the first multiple quantum well structure 142 formed subsequently can be well released. As a result, the first multiple quantum well structure 142 serving as the main part for emitting light can have better epitaxy quality. This can improve the work efficiency, such as light-emitting efficiency, as a whole for the nitride semiconductor structure 100. In other embodiments, the second multiple quantum well structure 144 can also emit light but the second multiple quantum well structure 144 is not serving as the main part for emitting light. The light intensity from the second multiple quantum well structure 144 is smaller than the light intensity from the first multiple quantum well structure 142. The light emitted from the second multiple quantum well structure 144 in wavelength range is different from the light emitted from the first multiple quantum well structure 142 in wavelength range.

Remarkably, if too many of cracks occur in the first multiple quantum well structure 142 and the second multiple quantum well structure 144, it may cause the issue about a sharp decline of illuminating level or even no capability to emit light for the first multiple quantum well structure 142 and the second multiple quantum well structure 144. So, when the doping concentration of the second dopant in the second barrier layer 146' is about between $10^{19}/cm^3$ and $9\times10^{19}/cm^3$, the density of the V-shape cracks P in the first multiple quantum well structure 142 and the second multiple quantum well structure 144 can be controlled to be within a specific range. In the situation, the nitride semiconductor structure 100 can have better light-emitting efficiency.

As the further descriptions, in FIG. 1, the V-shape cracks P are evenly distributed in the second multiple quantum well structure 144 and the sizes of the V-shape cracks P are similar. However in practical situation, the V-shape cracks P are randomly distributed in the second multiple quantum well structure 144. In other words, the number of the V-shape cracks P at one area in the second multiple quantum well structure 144 may be relative high and the number of the V-shape cracks P at another area in the second multiple quantum well structure 144 may be relative low, and the sizes of the V-shape cracks P are different. Further in the embodiment, after the second multiple quantum well structure 144 is formed, the first multiple quantum well structure 142 formed subsequently has no the second type dopant. The first multiple quantum well structure 142 covers and fills over the V-shape cracks P to gradually get flat. The density of the V-shape cracks P is then gradually decreasing. Therefore, the density of the V-shape cracks P in the second multiple quantum well structure 144 is higher than the density of the V-shape cracks P in the first multiple quantum well structure 142. In the drawing, the size ratio, the locations and the number of the V-shape cracks P distributed in the second multiple quantum well structure 144 are just schematically illustrated, but not for limitation.

Further, in an embodiment not shown in drawing, the nitride semiconductor structure 100 can include a nucleus layer, disposed between the substrate 110 and the buffer layer 120. The material of the nucleus layer can be aluminum nitride (AlN) or gallium nitride (GaN).

Figure 3:
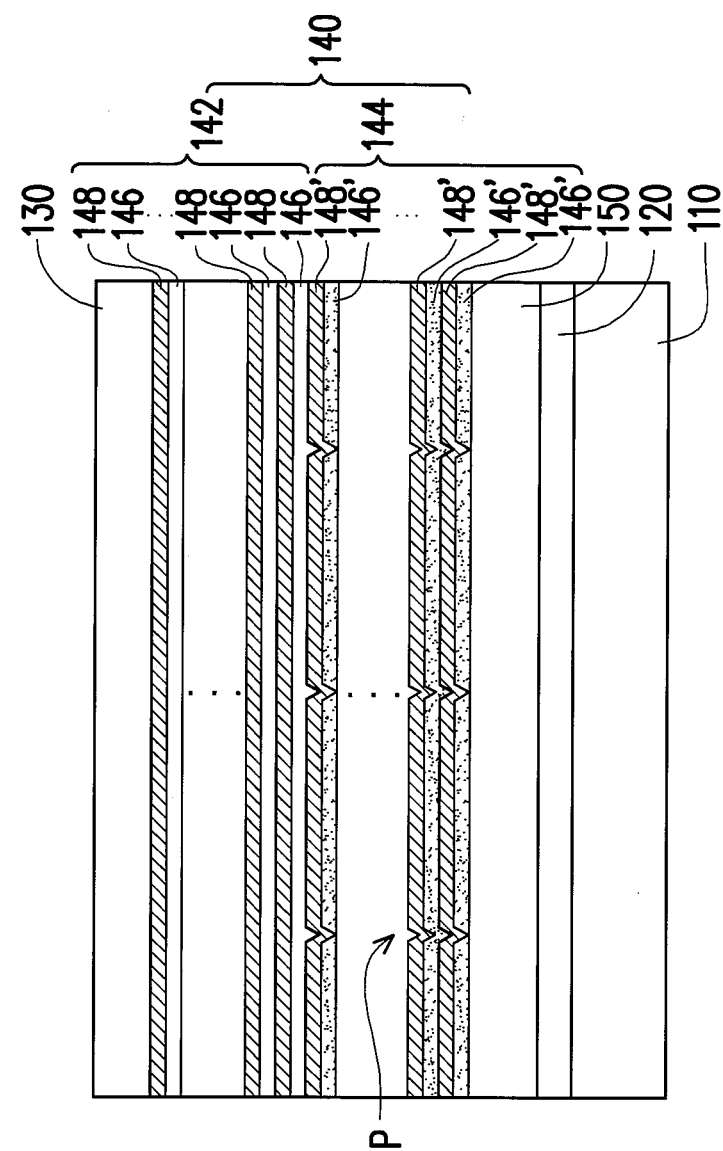
FIG. 3 is a drawing, schematically illustrating a cross-sectional structure of a nitride semiconductor structure, according to another embodiment of the invention.

FIG. 3 is a drawing, schematically illustrating a cross-sectional structure of a nitride semiconductor structure, according to another embodiment of the invention. Referring to FIG. 3, those elements in the nitride semiconductor structure 200 of FIG. 3 being same or similar to the elements in the nitride semiconductor structure 100 of FIG. 1 are using the same reference numerals without further descriptions. The main difference between the nitride semiconductor structure 200 of FIG. 3 and the nitride semiconductor structure 100 of FIG. 1 is that the second type dopant is doped into any one of the second barrier layers 146' in FIG. 1. In the embodiment, the second type dopant is doped into all of the second barrier layers 146'.

Likewise, the doping concentration of the second type dopant in the second barrier layers 146' is higher than a doping concentration of the second type dopant in the second type nitride semiconductor layer 150. For example, the doping concentration of the second type dopant in the second barrier layers 146' is about between $10^{19}/cm^3$ and $9\times10^{19}/cm^3$. The doping concentration of the second type dopant in the second type nitride semiconductor layer 150 is about between $10^{18}/cm^3$ and $9\times10^{18}/cm^3$.

Since the doping concentration of the second type dopant in the second barrier layers 146' is relatively higher, the V-shape cracks P are easily produced in the second barrier layers 146' with openings toward the first type nitride semiconductor layer 130. When the first multiple quantum well structure 142 is formed subsequently, a portion of the first multiple quantum well structure 142 would fill into the V-shape cracks P so that the stress existing in the first multiple quantum well structure 142 can be released in better condition and further the first nitride semiconductor layer 130 can have better epitaxy quality, and further the nitride semiconductor structure 200 as a whole can have improved work efficiency, such as light-emitting efficiency.

Figure 4:
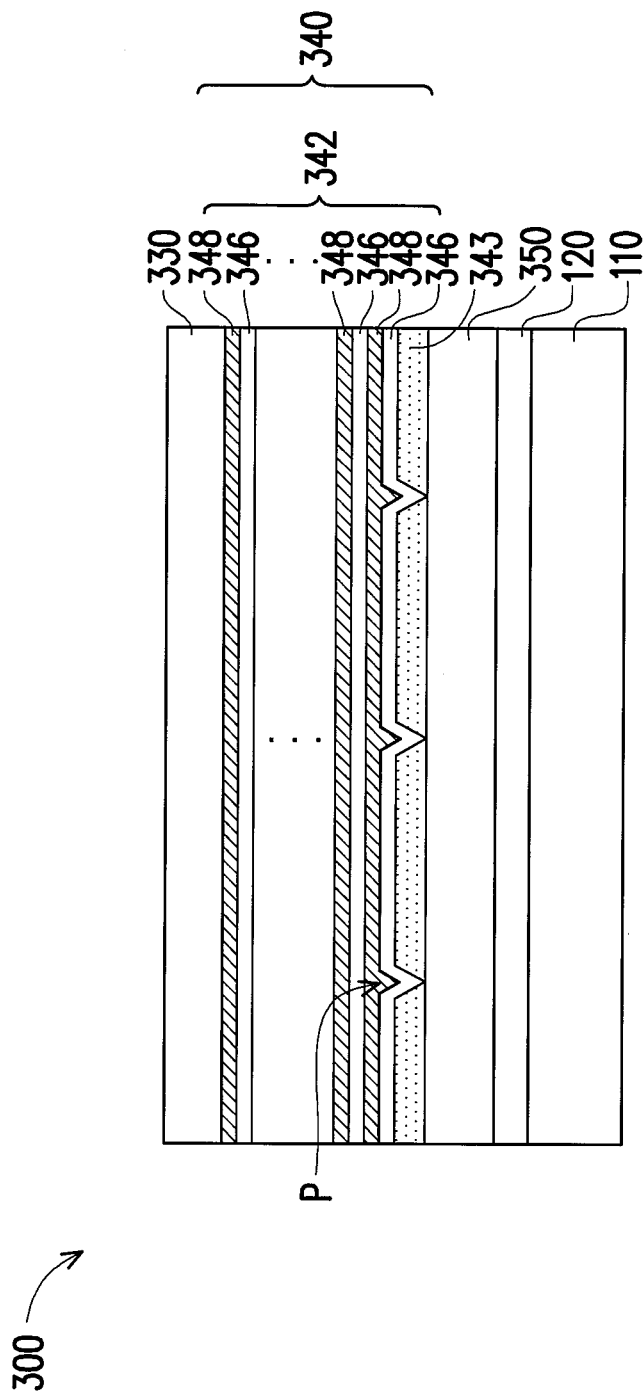
FIG. 4 is a drawing, schematically illustrating a cross-sectional structure of a nitride semiconductor structure, according to another embodiment of the invention.

FIG. 4 is a drawing, schematically illustrating a cross-sectional structure of a nitride semiconductor structure, according to another embodiment of the invention. Referring to FIG. 4, those elements in the nitride semiconductor structure 300 of FIG. 4 being same or similar to the elements in the nitride semiconductor structure 100 of FIG. 1 are using the same reference numerals without further descriptions. The main difference between the nitride semiconductor structure 300 of FIG. 4 and the nitride semiconductor structure 100 of FIG. 1 is that the active layer 140 in the nitride semiconductor structure 100 of FIG. 1 includes the first multiple quantum well structure 142 and the second multiple quantum well structure 144 and the first multiple quantum well structure 142 has no the second type dopant, and the second type dopant is doped into one of the second barrier layers 146'.

In the embodiment, the active layer 340 of the nitride semiconductor structure 300 includes a first multiple quantum well structure 342 and a heavily doped layer 343, wherein the first multiple quantum well structure 342 is a structure including multiple first barrier layers 346 and multiple first quantum well layers 348, which are staked by interlacing. The first multiple quantum well structure 342 is disposed between a first type nitride semiconductor layer 330 and the heavily doped layer 343. The second type dopant is doped into the heavily doped layer 343 and the doping concentration of the second type dopant in the heavily doped layer 343 is higher than the doping concentration of the second type dopant in a second nitride semiconductor layer 350.

In the embodiment, the heavily doped layer 343 includes gallium nitride, but in the other embodiments, the heavily doped layer 343 can include InGaN or AlGaN, and the heavily doped layer 343 is not limited to those materials. The first type dopant is selected from the elements of IIA group and the second type dopant is selected from the elements of IVA group. The first type dopant in an example is magnesium and the second type dopant in an example is silicon. The doping concentration of the second type dopant in the heavily doped layer 343 is about between $10^{19}/cm^3$ and $9\times10^{19}/cm^3$. The doping concentration of the second type dopant in the second type nitride semiconductor layer 350 is about between $10^{18}/cm^3$ and $9\times10^{18}/cm^3$.

Since the heavily doped layer 343 has the Si dopant with higher doping concentration, the V-shape cracks P are easily produced in the heavily doped layer 343. Openings of the V-shape cracks P are toward the first type nitride semiconductor layer 330. Thus, when the first multiple quantum well structure 342 is subsequently formed, a portion of the first multiple quantum well structure 342 would fill into the V-shape cracks P, so that the stress existing in the first multiple quantum well structure 342 and the second type nitride semiconductor layer 330, which are formed subsequently, can be released in better condition. As a result, the nitride semiconductor structure 300 as a whole can have improved work efficiency, such as light-emitting efficiency.

Remarkably, if too many of cracks occur in the heavily doped layer 343, it may cause the issue about a sharp decline of illuminating level or even no capability to emit light for the first multiple quantum well structure 342. So, when the doping concentration of the second dopant in the heavily doped layer 343 is about between $10^{19}/cm^3$ and $9\times10^{19}/cm^3$, the density of the V-shape cracks P in the heavily doped layer 343 can be controlled to be within a specific range. In the situation, the nitride semiconductor structure 300 can have better light-emitting efficiency.

Figure 5:
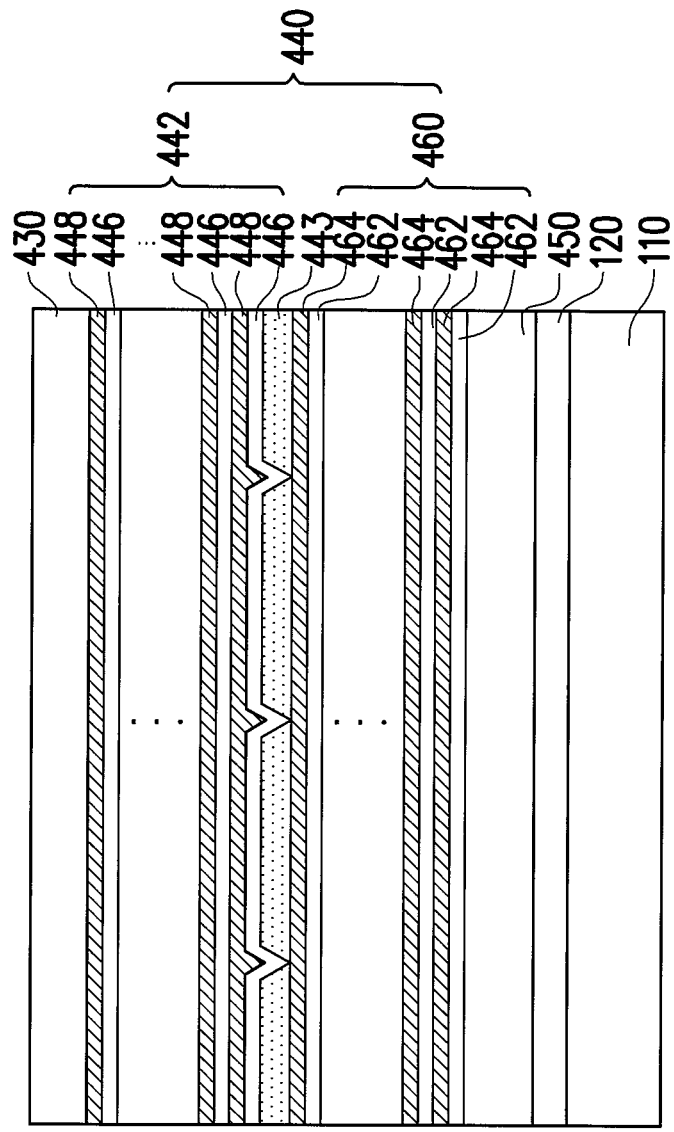
FIG. 5 is a drawing, schematically illustrating a cross-sectional structure of a nitride semiconductor structure, according to another embodiment of the invention.

FIG. 5 is a drawing, schematically illustrating a cross-sectional structure of a nitride semiconductor structure, according to another embodiment of the invention. Referring to FIG. 5, those elements in the nitride semiconductor structure 400 of FIG. 5 being same or similar to the elements in the nitride semiconductor structure 100 of FIG. 1 are using the same reference numerals without further descriptions. The main difference between the nitride semiconductor structure 400 of FIG. 5 and the nitride semiconductor structure 300 of FIG. 4 is that the active layer 440 in the nitride semiconductor structure 400 of FIG. 5 further includes a second multiple quantum well structure 460, disposed between the nitride semiconductor layer 450 and the heavily doped layer 443. In the embodiment, the second multiple quantum well structure 460 is a structure including multiple second barrier layers 462 and multiple second quantum well layers 464, which are stacked by interlacing. The material of the second barrier layers 462 includes gallium nitride and the material of the second quantum well layers 464 includes InGaN. The number of the second quantum well layers 464 is more than the number of the first quantum well layers 448. For example, the number of the first quantum well layers 448 is between 3 and 15 and the number of the second quantum well layers 464 is between 13 and 25, but the number of the first quantum well layers 448 and the number of the second quantum well layers 464 are not limited to those numbers.

In the embodiment, the doping concentration of the second type dopant in the second multiple quantum well structure 460 is about between $10^{16}/cm^3$ and $5\times10^{18}/cm^3$. In comparison with the first multiple quantum well structure 442 without doping with silicon, in the embodiment, the light emitted from the first multiple quantum well structure 442 in wavelength range can be different from the light emitted from the second multiple quantum well structure 460 in wavelength range. Certainly, in the other embodiment, the second multiple quantum well structure 460 can be designed to be not emitting light but not for the limitation.

The doping concentrations of the second type dopant in the heavily doped layer 443 for the nitride semiconductor structure 400 of the embodiment and the nitride semiconductor structure 300 in FIG. 4 are the same about between $10^{19}/cm^3$ and $9\times10^{19}/cm^3$, so the V-shape cracks P formed in the heavily doped layer 443 can have a certain density. Due to the existence of the proper number of the cracks, when the first multiple quantum well structure 442 is formed subsequently, the stress of the first multiple quantum well structure 442 can be released in better condition, and further the nitride semiconductor structure 400 as a whole can have better light-emitting efficiency.

As to the foregoing descriptions, the nitride semiconductor structure of the invention dopes the second type dopant into at least one of the second barrier layers, and the doping concentration of the second type dopant in the second barrier layer is higher than the doping concentration of the second type dopant in the second type nitride semiconductor layer, so the multiple V-shape cracks exit in the first multiple quantum well structure. Alternatively, the nitride semiconductor structure of the invention has the heavily doped layer with high concentration of the second typo dopant, multiple V-shape cracks with openings toward the first type semiconductor layer exit in the heavily doped layer. Due to the formation of V-shape cracks, when the first multiple quantum well structure is formed subsequently, the stress exiting in the first multiple quantum well structure can be released in better condition, an further the nitride semiconductor structure as a whole can have improved work efficiency, such as light emitting efficiency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A nitride semiconductor structure, comprising:
   a substrate;
   a first type nitride semiconductor layer, disposed on the substrate, wherein a first type dopant is doped into the first type nitride semiconductor layer;
   an active layer, disposed between the substrate and the first type nitride semiconductor layer, and comprising a first multiple quantum well structure and a second multiple quantum well structure, wherein the first multiple quantum well structure is a structure including a plurality of first quantum well layers and a plurality of first barrier layers stacked by interlacing, the second multiple quantum well structure is a structure including a plurality of second quantum well layers and a plurality of second barrier layers stacked by interlacing, and the first multiple quantum well structure is disposed between the first type nitride semiconductor layer and the second multiple quantum well structure; and
   a second type nitride semiconductor layer, disposed between the substrate and the active layer, a second type dopant being doped into the second type nitride semiconductor layer,
   wherein the second type dopant is doped into at least one of the second barrier layers, and a doping concentration of the second type dopant in the second barrier layer is higher than a doping concentration of the second type dopant in the second type nitride semiconductor layer.

2. The nitride semiconductor structure of claim 1, wherein the second type dopant is doped into the second barrier layers, and the doping concentration of the second type dopant in the second barrier layers is higher than the doping concentration of the second type dopant in the second type nitride semiconductor layer.

3. The nitride semiconductor structure of claim 1, wherein the first type dopant is selected from elements of IIA group, and the second type dopant is selected from elements of IVA group.

4. The nitride semiconductor structure of claim 3, wherein the first type dopant is magnesium and the second type dopant is silicon.

5. The nitride semiconductor structure of claim 1, wherein the second multiple quantum well structure has a plurality of V-shape cracks.

6. The nitride semiconductor structure of claim 5, wherein the first multiple quantum well structure has a plurality of V-shape cracks and a density of the V-shape cracks in the second multiple quantum well structure is higher than a density of the V-shape cracks in the first multiple quantum well structure.

7. The nitride semiconductor structure of claim 1, wherein a surface of the second multiple quantum well structure is not smooth, in which the surface has multiple indents and a portion of the first multiple quantum well structure fills into the indents.

8. The nitride semiconductor structure of claim 1, wherein a doping concentration of the second type dopant in the second barrier layer is about between $10^{19}/cm^3$ and $9\times10^{19}/cm^3$, a doping concentration of the second type dopant in the second type nitride semiconductor layer is about between $10^{18}/cm^3$ and $9\times10^{18}/cm^3$.

9. The nitride semiconductor structure of claim 1, wherein a number of the second quantum well layers is more than a number of the first quantum well layers.

10. The nitride semiconductor structure of claim 9, wherein the number of the first quantum well layers is between 3 and 15, and the number of the second quantum well layers is between 13 and 25.

11. The nitride semiconductor structure of claim 1, wherein the second multiple quantum well structure does not emit light, or the second multiple quantum well structure emits a light with a wavelength range different from a wavelength range of a light emitted by the first multiple quantum well structure.

12. The nitride semiconductor structure of claim 1, wherein the first multiple quantum well structure has no the second type dopant.

13. A nitride semiconductor structure, comprising:
    a substrate;
    a first type nitride semiconductor layer, disposed on the substrate, wherein a first type dopant is doped into the first type nitride semiconductor layer;
    an active layer, disposed between the substrate and the first type nitride semiconductor layer and comprising a first multiple quantum well structure and a heavily doped layer, wherein the first multiple quantum well structure is a structure including a plurality of first quantum well layers and a plurality of first barrier layers stacked by interlacing, and the first multiple quantum well structure is disposed between the first nitride semiconductor layer and the heavily doped layer; and a second type nitride semiconductor layer, disposed between the substrate and the active layer, a second type dopant being doped into the second type nitride semiconductor layer, wherein the second type dopant is doped into the heavily doped layer, and a doping concentration of the second type dopant in the heavily doped layer is higher than a doping concentration of the second type dopant in the second type nitride semiconductor layer.

14. The nitride semiconductor structure of claim 13, wherein the first type dopant is selected from elements of IIA group, and the second type dopant is selected from elements of IVA group.

15. The nitride semiconductor structure of claim 14, wherein the first type dopant is magnesium and the second type dopant is silicon.

16. The nitride semiconductor structure of claim 13, wherein the heavily doped layer has a plurality of V-shape cracks and a portion of the first multiple quantum well structure fills into the V-shape cracks.

17. The nitride semiconductor structure of claim 13, wherein a surface of the heavily doped layer is not smooth, in which the surface has a plurality of indents and a portion of the first multiple quantum well structure fills into the indents.

18. The nitride semiconductor structure of claim 13, wherein a doping concentration of the second type dopant in the heavily doped layer is about between $10^{19}/cm^3$ and $9\times10^{19}/cm^3$, and a doping concentration of the second type dopant in the second type nitride semiconductor layer is about between $10^{18}/cm^3$ and $9\times10^{18}/cm^3$.

19. The nitride semiconductor structure of claim 13, wherein the active layer further comprises a second multiple quantum well structure, wherein the second multiple quantum well structure is a structure including a plurality of second quantum well layers and a plurality of second barrier layers stacked by interlacing, and the second multiple quantum well structure is disposed between the second type nitride semiconductor layer and the heavily doped layer.

20. The nitride semiconductor structure of claim 19, wherein the second multiple quantum well structure does not emit light, or the second multiple quantum well structure emits a light with a wavelength range different from a wavelength range of a light emitted by the first multiple quantum well structure.

21. The nitride semiconductor structure of claim 19, wherein a number of the second quantum well layers is more than a number of the first quantum well layers.

22. The nitride semiconductor structure of claim 21, wherein the number of the first quantum well layers is between 3 and 15, and the number of the second quantum well layers is between 13 and 25.

23. The nitride semiconductor structure of claim 13, wherein the first multiple quantum well structure has no the second type dopant.

* * * * *